United States Patent
Wu et al.

(10) Patent No.: US 10,063,214 B2
(45) Date of Patent: Aug. 28, 2018

(54) PROGRAMMABLE BAND-PASS FILTER CIRCUIT OF ANALOG FRONT-END USED FOR CAPACITANCE DETECTION

(71) Applicant: PixArt Imaging Inc., Hsin-Chu (TW)

(72) Inventors: Sung-Han Wu, Hsin-Chu (TW); Chang-Yuan Liou, Hsin-Chu (TW)

(73) Assignee: PixArt Imaging Inc., Hsin-Chu (TW)

( * ) Notice: Subject to any disclaimer, the term of this patent is extended or adjusted under 35 U.S.C. 154(b) by 7 days.

(21) Appl. No.: 15/347,789

(22) Filed: Nov. 10, 2016

(65) Prior Publication Data

US 2017/0063340 A1    Mar. 2, 2017

Related U.S. Application Data

(63) Continuation-in-part of application No. 15/080,718, filed on Mar. 25, 2016.

(30) Foreign Application Priority Data

Mar. 26, 2015   (TW) .............................. 104109783 A
Jul. 20, 2016    (TW) .............................. 105122850 A

(51) Int. Cl.
    *H03B 1/00*        (2006.01)
    *H03H 11/12*     (2006.01)
    *G06F 3/041*     (2006.01)
    *G06F 3/044*     (2006.01)

(52) U.S. Cl.
    CPC ........... *H03H 11/126* (2013.01); *G06F 3/044* (2013.01); *G06F 3/0416* (2013.01); *H03H 11/1217* (2013.01)

(58) Field of Classification Search
None
See application file for complete search history.

(56) References Cited

U.S. PATENT DOCUMENTS

| | | | | |
|---|---|---|---|---|
| 3,911,776 | A * | 10/1975 | Beigel ...................... | G10H 1/14 327/47 |
| 8,305,360 | B2 * | 11/2012 | Wu .......................... | G06F 3/044 345/173 |
| 8,547,114 | B2 * | 10/2013 | Kremin .................... | G06F 3/044 324/678 |
| 9,197,207 | B2 * | 11/2015 | Hsieh ..................... | H03K 17/962 |
| 9,587,964 | B2 * | 3/2017 | Curtis ................... | G01D 5/2405 |
| 9,830,018 | B2 * | 11/2017 | Lu .......................... | G06F 3/0418 |
| 2008/0109189 | A1 * | 5/2008 | Bauer .................... | G01D 5/202 702/189 |
| 2009/0319212 | A1 * | 12/2009 | Cech .................... | B60R 21/0136 702/65 |

(Continued)

*Primary Examiner* — Lincoln Donovan
*Assistant Examiner* — Khareem E Almo
(74) *Attorney, Agent, or Firm* — Winston Hsu

(57) ABSTRACT

A programmable band-pass filter circuit, which is included by an analog front-end circuit and used for capacitance detection, includes an operational amplifier, an input resistor, a feedback resistor, and a feedback capacitor. The operational amplifier includes a first input coupled to a reference level, a second input, and an output. The input resistor has a first end coupled to a sensed capacitor and a second end coupled to the second input of the operational amplifier. The feedback resistor and feedback capacitor are connected between the second input of the operational amplifier and the output of the operational amplifier, respectively.

17 Claims, 6 Drawing Sheets

(56) References Cited

U.S. PATENT DOCUMENTS

| | | | |
|---|---|---|---|
| 2010/0013779 A1* | 1/2010 | Wu | G06F 3/0412 345/173 |
| 2010/0085325 A1* | 4/2010 | King-Smith | G06F 3/03545 345/174 |
| 2014/0368459 A1* | 12/2014 | Lei | G06F 3/044 345/174 |
| 2015/0130755 A1* | 5/2015 | Jain | G06F 3/044 345/174 |
| 2015/0333712 A1* | 11/2015 | Deliwala | H03F 3/08 600/476 |
| 2017/0063340 A1* | 3/2017 | Wu | G06F 3/0416 |
| 2017/0075472 A1* | 3/2017 | Min | G06F 3/0418 |
| 2017/0356812 A1* | 12/2017 | Madden | G01L 1/144 |
| 2017/0364208 A1* | 12/2017 | King-Smith | G06F 3/0418 |

* cited by examiner

PROGRAMMABLE BAND-PASS FILTER CIRCUIT OF ANALOG FRONT-END USED FOR CAPACITANCE DETECTION

CROSS REFERENCE TO RELATED APPLICATIONS

This application is a continuation in part application and claims the benefit of U.S. Non-provisional application Ser. No. 15/080,718, filed on Mar. 25, 2016, and is included herein by reference.

BACKGROUND OF THE INVENTION

1. Field of the Invention

The invention relates to a capacitance sensing mechanism, and more particularly to a programmable band-pass filter circuit of an analog front-end circuit applied for capacitance sensing/detection.

2. Description of the Prior Art

Generally speaking, a conventional capacitance sensing mechanism is arranged to adopt a programmable gain amplifier and an anti-aliasing filter to perform the operation of converting the capacitance of a sensed capacitor into a voltage value and perform the operation of anti-aliasing, respectively. This, however, inevitably causes high circuit costs. In addition, the conventional capacitance sensing mechanism may introduce the smearing effect which causes that the capacitances of non-touched cell(s) are increased due to adjacent touched cell (s), and thus the conventional capacitance sensing mechanism may generate a false sensing result.

SUMMARY OF THE INVENTION

Therefore one of the objectives of the present invention is to provide a programmable band-pass filter circuit of an analog front-end circuit for capacitance sensing, to solve the above-mentioned problems.

According to embodiments of the invention, a programmable band-pass filter circuit included by an analog front-end circuit and used for capacitance detection is disclosed. The programmable band-pass filter circuit comprises an operational amplifier, an input resistor, a feedback resistor, and a feedback capacitor. The operational amplifier has a first input, a second input, and an output, and the first input is coupled to a reference level. The input resistor has a first end coupled to a sensed capacitor and a second end coupled to the second input of the operational amplifier. The feedback resistor is coupled between the second input of the operational amplifier and the output of the operational amplifier. The feedback capacitor is coupled between the second input of the operational amplifier and the output of the operational amplifier.

According to the embodiments of the invention, a programmable band-pass filter circuit included by an analog front-end circuit and used for capacitance detection is further disclosed. The programmable band-pass filter circuit comprises an operational amplifier, a feedback resistor, a feedback capacitor, and a shunt circuit. The operational amplifier has a first input, a second input, and an output wherein the first input is coupled to a reference level and the second input is coupled to a sensed capacitor. The feedback resistor is coupled between the second input of the operational amplifier and the output of the operational amplifier. The feedback capacitor is coupled between the second input of the operational amplifier and the output of the operational amplifier. The shunt circuit has a first end coupled between the second input of the operational amplifier and the sensed capacitor and has a second end coupled to the reference level. The shunt circuit is configured for lowering a voltage amplitude of a signal at the second input of the operational amplifier.

According to the embodiments of the invention, a programmable band-pass filter circuit included by an analog front-end circuit and used for capacitance detection is further disclosed. The programmable band-pass filter circuit comprises an operational amplifier, a feedback resistor, a feedback capacitor, a voltage buffer circuit, and a shunt resistor. The operational amplifier has a first input, a second input, and an output wherein the first input is coupled to a reference level and the second input is coupled to a sensed capacitor. The feedback resistor is coupled between the second input of the operational amplifier and the output of the operational amplifier. The feedback capacitor is coupled between the second input of the operational amplifier and the output of the operational amplifier. The voltage buffer circuit is coupled to the reference level and configured for buffering and outputting the reference level. The shunt resistor has a first end coupled between the second input of the operational amplifier and the sensed capacitor and having a second end coupled to an output of the voltage buffer circuit to couple to the buffered reference level.

According to the above embodiments, the programmable band-pass filter circuits are capable of performing the functions and operations of generating corresponding voltage values according to sensed capacitors, high-pass filtering, and low-pass filtering, so that the circuit size of the analog front-end circuit can be reduced to be smaller. In addition, by using the shunt circuit, the smearing effect caused by the conventional capacitance sensing mechanism can be reduced and the signal dynamic range can be improved. In addition, the circuit cost can be lowered and the system perform can become stable if the shunt circuit is implemented by using a shunt resistor and a voltage buffer circuit which is implemented by using another operational amplifier.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
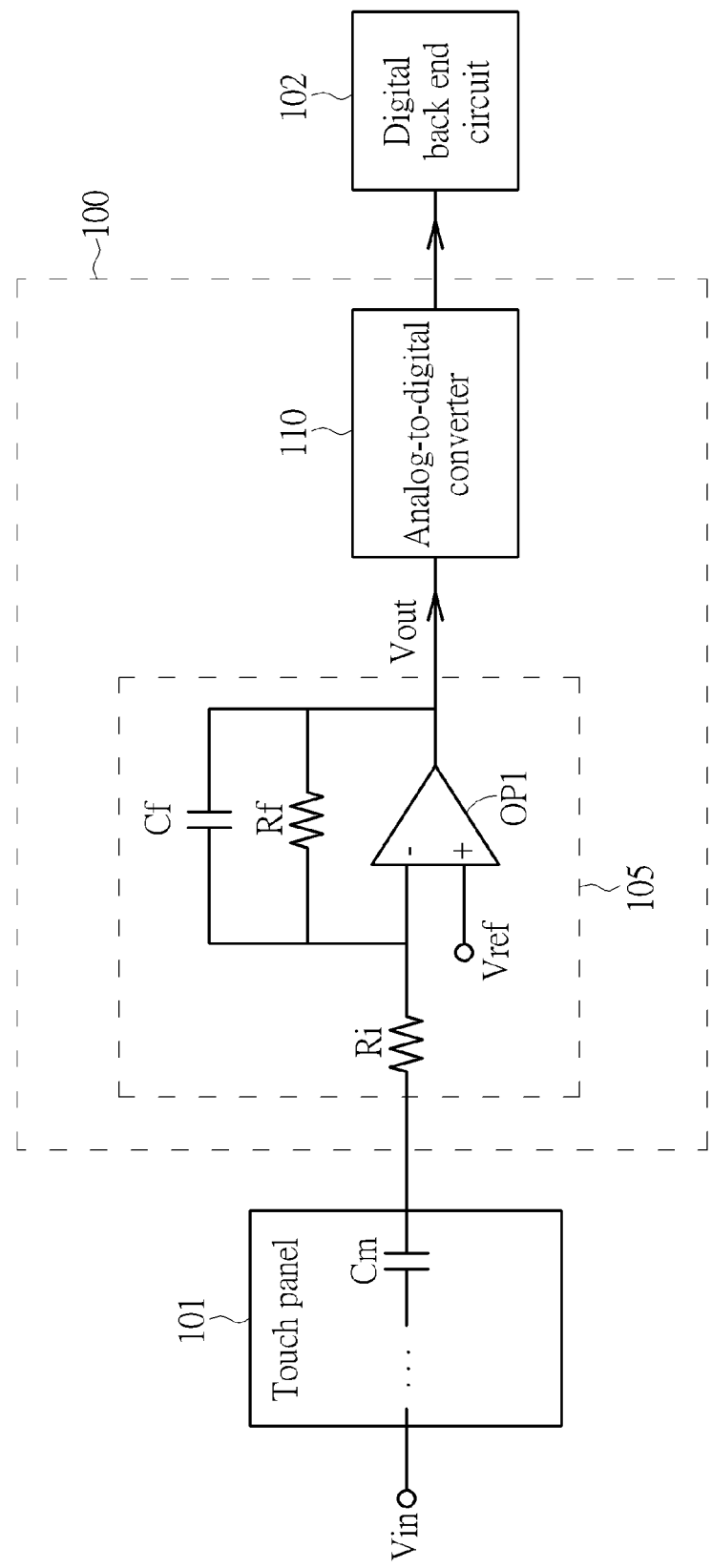
FIG. 1 is a circuit diagram of an analog front-end circuit used for capacitance sensing/detection according to an embodiment of the present invention.

FIG. 1 is a circuit diagram of an analog front-end circuit 100 used for capacitance sensing/detection according to an embodiment of the present invention. The analog front-end circuit 100 includes a programmable band-pass filter (PBPF) circuit 105 and an analog-to-digital converter 110. The PBPF circuit 105 is coupled to a touch panel 101 and coupled to a digital backend circuit 102 (via the analog-to-digital converter 110), and it includes functions and operations of generating a corresponding voltage according to a sensed capacitor, high-pass filtering, and low-pass filtering. Compared to the conventional mechanism, the circuit size of analog front-end circuit 100 in this embodiment can be reduced to be smaller. The input of the analog front-end circuit 100 is coupled to the touch panel 101 and its output is coupled to the digital backend circuit 102. The touch panel 101 is capable of performing self-capacitance sensing/detection and/or mutual-capacitance sensing/detection to detect a touch event/control of a user. The PBPF circuit 105 is arranged for coupling to the self-capacitance and/or mutual-capacitance of sensed capacitor(s) formed by the touch panel 101 to detect the touch event/control of the user. The PBPF circuit 105 is capable of generating a corresponding voltage signal according to the formed self-capacitance and/or mutual-capacitance, filtering out low-frequency noise component(s) in the voltage signal through the high-pass filtering function, and filtering out high-frequency noise component(s) in the voltage signal through the low-pass filtering function to reduce or avoid anti-aliasing for the voltage signal. After that, an analog output signal generated by the PBPF circuit 105 is converted to a digital output signal by the analog-to-digital converter 110, and the digital backend circuit 105 performs signal processing according to the digital output signal.

In practice, the PBPF circuit 105 includes an operational amplifier OP1, a resistor Ri, a feedback capacitor Cf, and a feedback resistor Rf. In the mutual-capacitance detection mode, for example, the input signal Vin is a driving signal, and the capacitor Cm is formed in response to a touch event of a user. The PBPF circuit 105 performs corresponding operations and functions in response to the formed mutual-capacitor in the mutual-capacitance detection mode. However, this is not meant to be a limitation. The PBPF circuit 105 is also capable of performing corresponding operations and functions in response to a formed self-capacitor in the self-capacitance detection mode.

The formed capacitor Cm is coupled between the input signal Vin and the resistor Ri. The resistor Ri is coupled between the inverting input of the operational amplifier OP1 and the capacitor Cm. The non-inverting input of the operational amplifier OP1 is coupled to a reference level Vref. The feedback capacitor Cf and feedback resistor Rf are respectively coupled between the inverting input of the operational amplifier OP1 and its output. The operational amplifier OP1 at its output generates the output signal Vout to the analog-to-digital converter 110. The frequency response of PBPF circuit 105 and corner frequencies Fc1 and Fc2 can be shown by the following equations:

$$\frac{Vout}{Vin} = -\frac{s \cdot R_f \cdot C_m}{1 + s \cdot (R_i \cdot C_m + R_f \cdot C_f) + s^2 \cdot R_i \cdot R_f \cdot C_m \cdot C_f}$$

$$Fc1 = \frac{1}{2\pi \cdot R_i \cdot C_m}$$

$$Fc2 = \frac{1}{2\pi \cdot R_f \cdot C_f}$$

Figure 2:
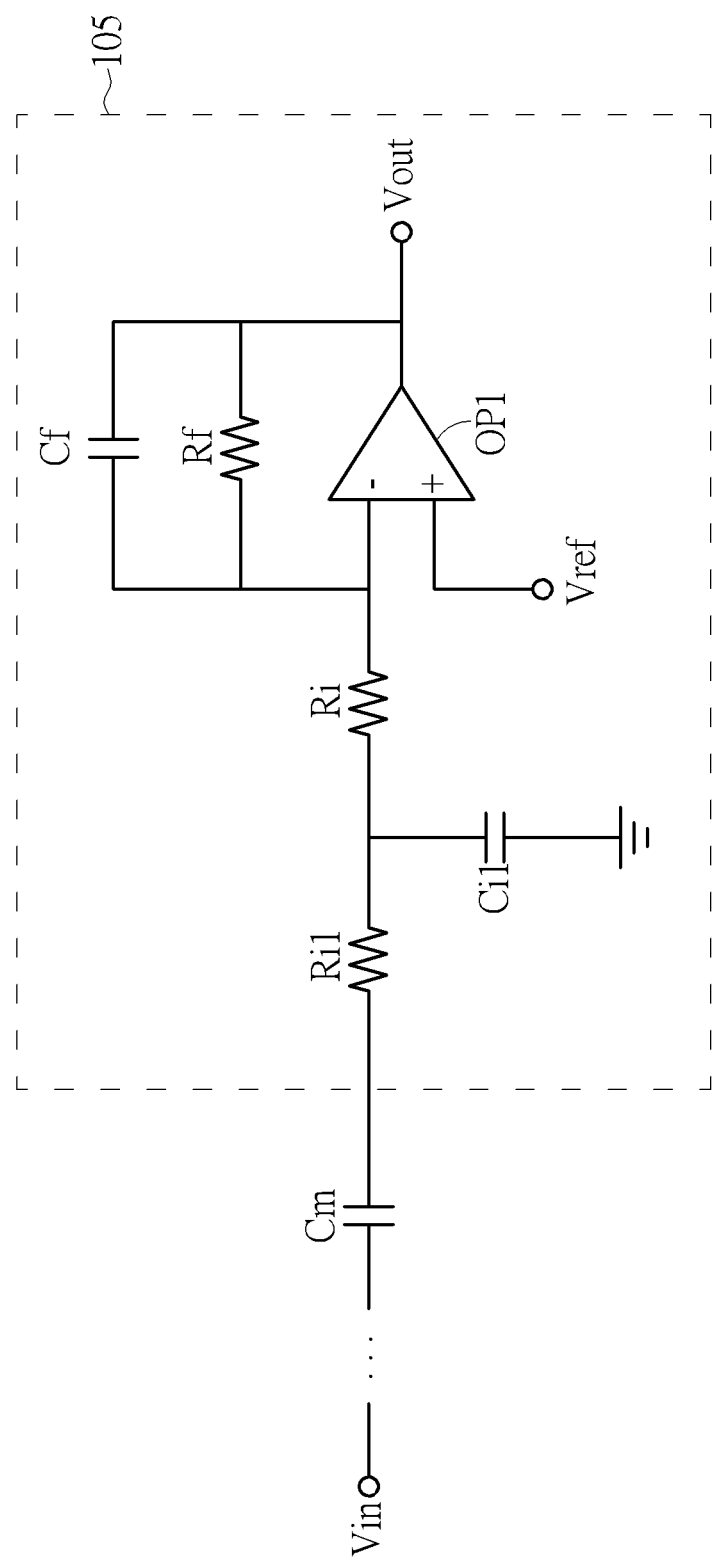
FIGS. 2-4 are circuit diagrams of different embodiments of the programmable band-pass filter circuit as shown in FIG. 1.

Additionally, in another embodiment, the PBPF circuit 105 may further include a low-pass filter circuit so as to increase the sharpness of its filter. FIG. 2 is a circuit diagram of another embodiment of the PBPF circuit 105 as shown in FIG. 1. The PBPF circuit 105 includes the operational amplifier OP1, resistor Ri, feedback capacitor Cf, feedback resistor Rf, a resistor Ri1, and a capacitor Ci1. In the mutual-capacitance detection mode, for example, the input signal Vin is a driving signal, and the capacitor Cm is formed in response to a touch event of a user; in addition, the PBPF circuit 105 is also capable of performing corresponding operations and functions in response to a formed self-capacitor in the self-capacitance detection mode. The formed capacitor Cm is coupled between the input signal Vin and resistor Ri1. The resistor Ri1 and capacitor Ci1 forms a low-pass filter circuit structure which includes an output, i.e. an intermediate node between resistor Ri1 and capacitor Ci1, and the intermediate node is coupled to the resistor Ri. The resistor Ri is coupled between the inverting input of the operational amplifier OP1 and coupled to the capacitor Cm via resistor Ri1. The non-inverting input of the operational amplifier OP1 is coupled to a reference level Vref. The feedback capacitor Cf and feedback resistor Rf are respectively coupled between the inverting input of the operational amplifier OP1 and its output. The operational amplifier OP1 at its output generates the output signal Vout to the analog-to-digital converter 110.

Additionally, in other embodiments, the capacitance of above-mentioned feedback capacitor Cf and/or the resistance of above-mentioned feedback resistor Rf can be designed to be variable or programmable, in response to different frequencies of different driving signals. Through the programmable capacitance of feedback capacitor Cf, the passband bandwidth of the PBPF circuit 105 and the gain value of the analog front-end circuit 100 can be adaptively adjusted or changed. In addition, through the programmable resistance of feedback resistor Rf, the passband bandwidth of the PBPF circuit 105 and the gain value of the analog front-end circuit 100 can be also adaptively adjusted or changed.

Figure 3:
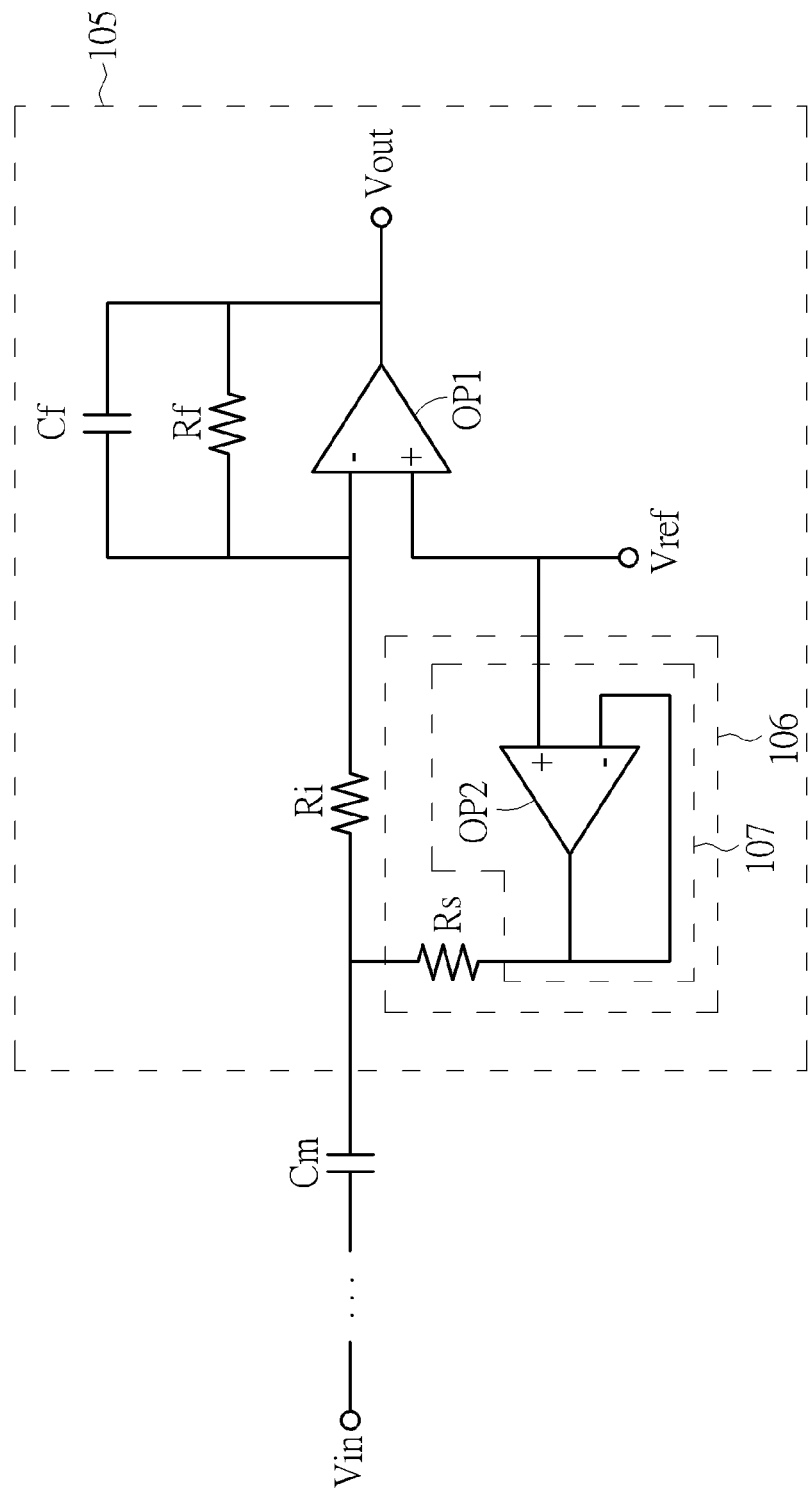

Furthermore, in another embodiment, the PBPF circuit 105 can further adopt a shunt circuit to improve the signal dynamic range and reduce the smearing effect. FIG. 3 is a circuit diagram of another embodiment of the PBPF circuit 105 as shown in FIG. 1. The PBPF circuit 105 includes the operational amplifier OP1, resistor Ri, feedback capacitor Cf, feedback resistor Rf, and a shunt circuit 106. The smearing effect of capacitance detection, for example, indicates that the capacitance of non-touched cell(s) adjacent to touched cell(s) may be inevitably increased due to the touched cell(s). The shunt circuit 106 of the embodiment can be used to solve this problem. The shunt circuit 106, in practice, includes a resistor Rs and a voltage buffer circuit 107 wherein the voltage buffer circuit 107 can be implemented by using the operational amplifier OP2 (but not limited) such as Metal-Oxide-Semiconductor Field-Effect Transistors (MOSFET) or Bipolar Junction Transistors (BJT). The first end of resistor Rs is coupled between the capacitor Cm and resistor Ri, and the second end of resistor Rs is coupled to the output of operational amplifier OP2. The voltage buffer circuit 107 is arranged to buffer and output the reference level Vref to the second end of resistor Rs. The non-inverting input of operational amplifier OP2 is coupled to the reference level Vref and its inverting end is coupled to the output of the operational amplifier OP2. It should be noted that the pole of the frequency response of PBPF circuit 105 is not affected by the shunt circuit 106. In addition, using the operational amplifier OP2 to implement the function and operation of voltage buffer circuit 107 can provide and obtain the advantages of low circuit cost and stable system performance.

Figure 4:
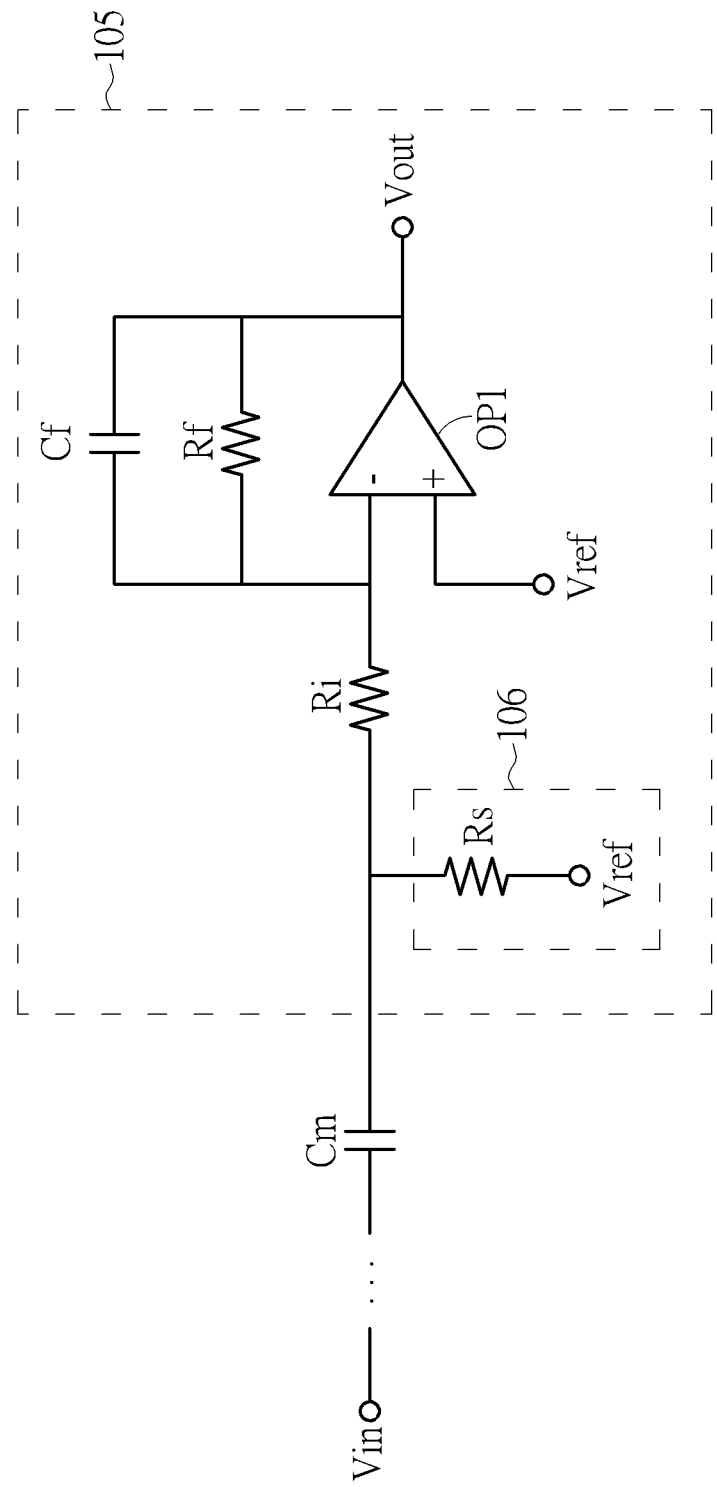

Furthermore, the shunt circuit 106 can be also implemented by adopting an impedance circuit unit. FIG. 4 is a circuit diagram of another embodiment of the PBPF circuit 105 as shown in FIG. 1. The PBPF circuit 105 of FIG. 4 includes the operational amplifier OP1, resistor Ri, feedback capacitor Cf, feedback resistor Rf, and the shunt circuit 106 wherein the shunt circuit 106 is implemented by using an impedance circuit unit such as the resistor Rs. The first end of the resistor Rs is coupled between the capacitor Cm and resistor Ri, and its second end is coupled to the reference level Vref.

Figure 5:
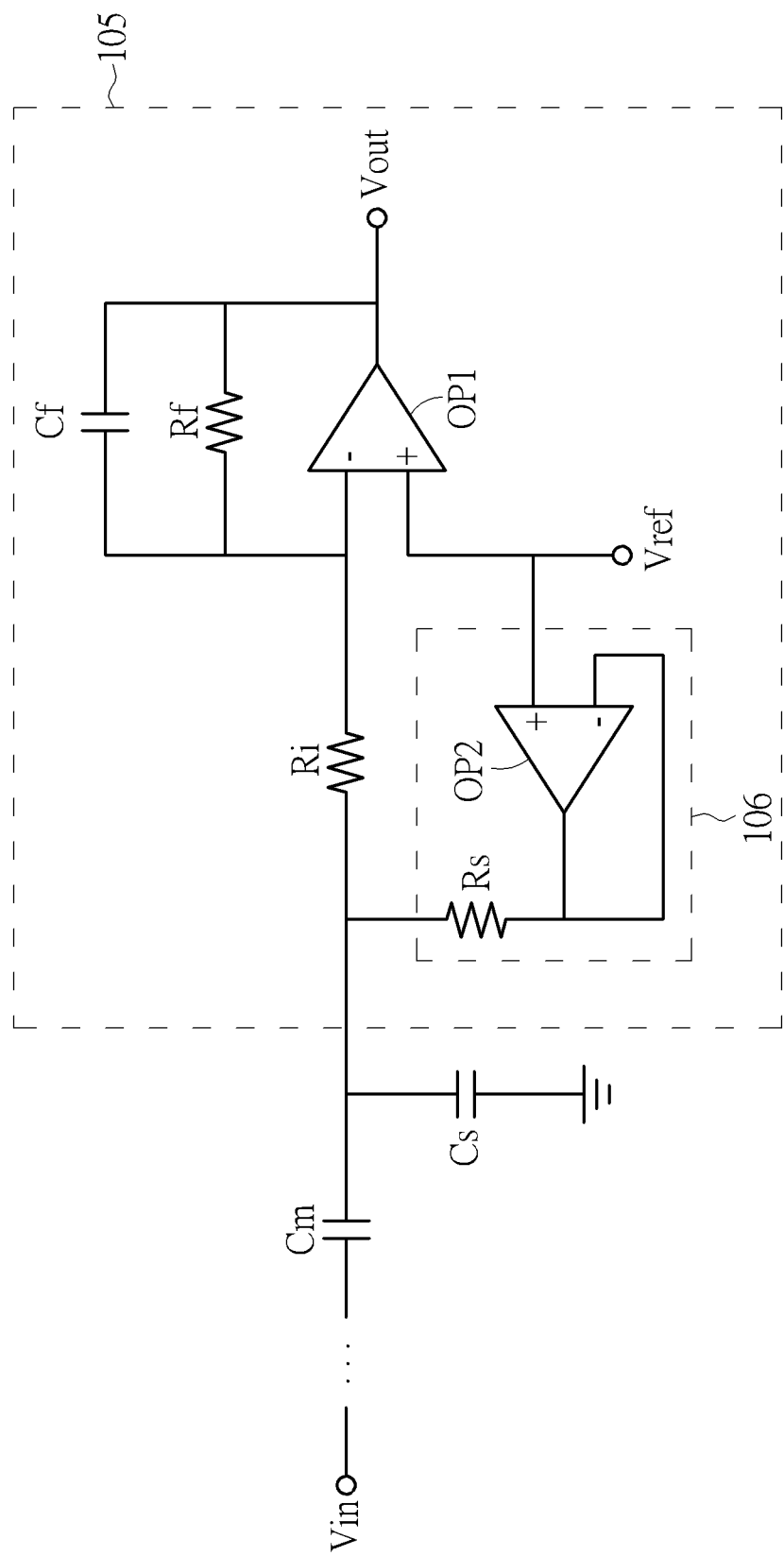
FIG. 5 is a circuit diagram showing the programmable band-pass filter circuit of FIG. 3 when applied for self-capacitance sensing and mutual-capacitance sensing.

Furthermore, the PBPF circuit 105 including the shunt circuit 106 as shown in FIG. 3 can be arranged to detect self-capacitance in the self-capacitance detection mode and/or detect mutual-capacitance in the mutual-capacitance detection mode. FIG. 5 is a circuit diagram of the embodiment of PBPF circuit 105 of FIG. 3 applied for self-capacitance detection and mutual-capacitance detection. Cs indicates the self-capacitance formed on a touch panel in response to a touch event of a user.

Figure 6:
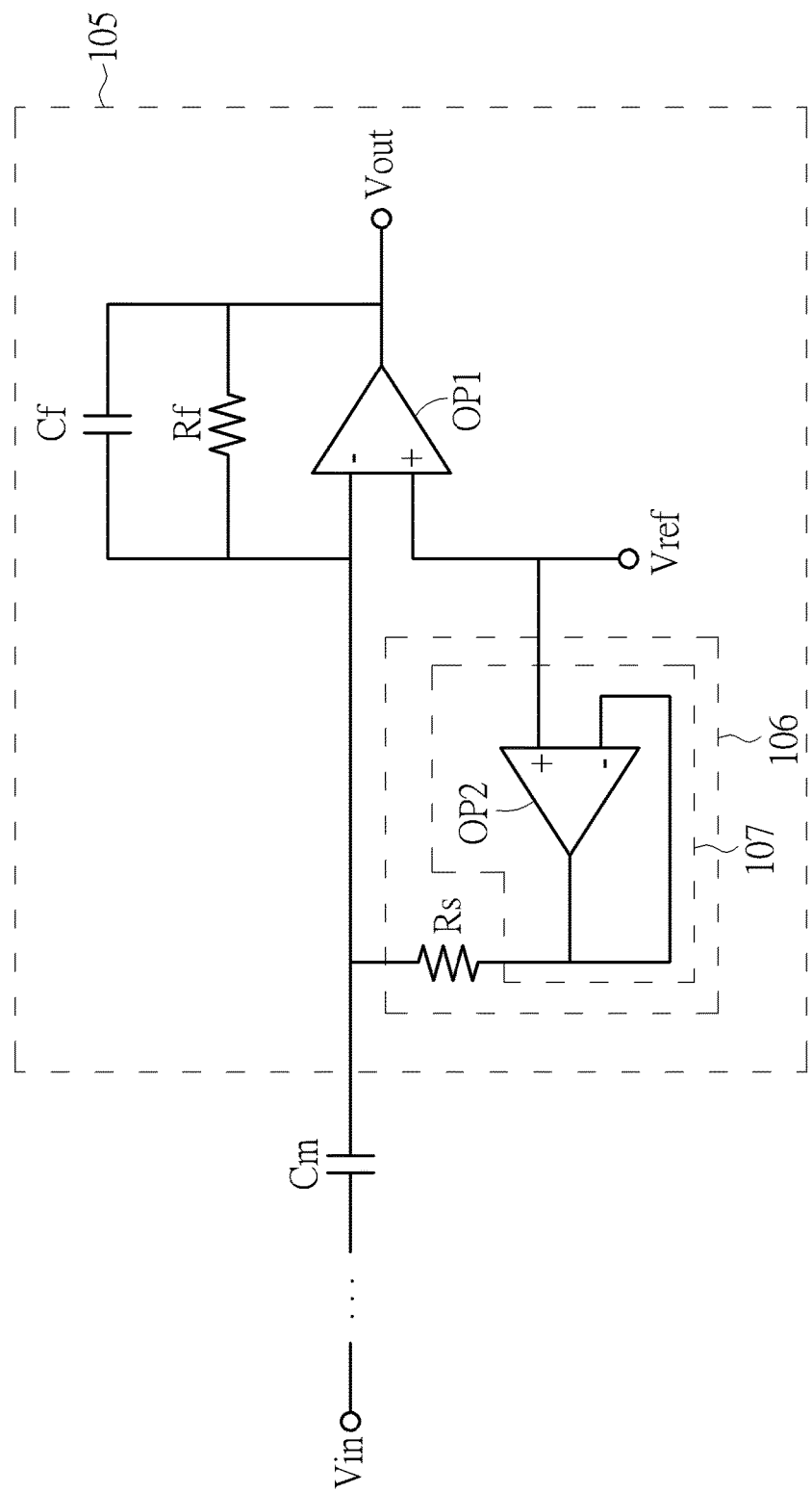
FIG. 6 is a circuit diagram of another embodiment of the programmable band-pass filter circuit of FIG. 1.

Furthermore, in another embodiment, the PBPF circuit 105 can be designed to include the shunt circuit 106 but excluded the input resistor Ri. FIG. 6 shows a circuit diagram of another embodiment of the PBPF circuit 105 as shown in FIG. 1. The first end of resistor Rs is coupled between the capacitor Cm and the inverting input of the operational amplifier OP1. The functions and operations of other circuit elements are identical to those of above-mentioned circuit elements, and further description is not detailed for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A programmable band-pass filter circuit included by an analog front-end circuit and used for capacitance detection, comprises:
    an operational amplifier, having a first input, a second input, and an output, the first input being coupled to a reference level;
    an input resistor, having a first end coupled to a sensed capacitor and a second end coupled to the second input of the operational amplifier;
    a feedback resistor, coupled between the second input of the operational amplifier and the output of the operational amplifier;
    a feedback capacitor, coupled between the second input of the operational amplifier and the output of the operational amplifier; and
    a low-pass filter circuit, comprising:
        a first resistor, having a first end coupled to the sensed capacitor and a second end coupled to the input resistor; and
        a first capacitor, having a first end coupled to the second end of the first resistor and a second end coupled to a ground level.

2. A programmable band-pass filter circuit included by an analog front-end circuit and used for capacitance detection, comprises:
    an operational amplifier, having a first input, a second input, and an output, the first input being coupled to a reference level;
    an input resistor, having a first end coupled to a sensed capacitor and a second end coupled to the second input of the operational amplifier;
    a feedback resistor, coupled between the second input of the operational amplifier and the output of the operational amplifier;
    a feedback capacitor, coupled between the second input of the operational amplifier and the output of the operational amplifier; and
    a shunt circuit, having a first end coupled between the input resistor and the sensed capacitor and having a second end coupled to the reference level, the shunt circuit being used for lowering a voltage amplitude of a signal at the first end; the shunt circuit is not placed on a feedback circuit path associated with the output of the operational amplifier.

3. The programmable band-pass filter circuit of claim 2, wherein the shunt circuit comprises:
    a voltage buffer circuit, coupled to the reference level, configured for buffering and outputting the reference level; and
    a shunt resistor, having a first end coupled between the input resistor and the sensed capacitor and having a second end coupled to an output of the voltage buffer circuit to couple to the buffered reference level.

4. The programmable band-pass filter circuit of claim 3, wherein the voltage buffer circuit is an amplifier circuit.

5. The programmable band-pass filter circuit of claim 2, wherein the shunt circuit comprises:
    a shunt resistor, having a first end coupled between the input resistor and the sensed capacitor and having a second end coupled to the reference level.

6. The programmable band-pass filter circuit of claim 1, wherein the sensed capacitor includes a self-capacitance and/or a mutual-capacitance.

7. The programmable band-pass filter circuit of claim 1, wherein the feedback resistor includes a programmable resistance.

8. The programmable band-pass filter circuit of claim 1, wherein the feedback capacitor includes a programmable capacitance.

9. A programmable band-pass filter circuit included by an analog front-end circuit and used for capacitance detection, comprises:
    an operational amplifier, having a first input, a second input, and an output, the first input being coupled to a reference level, the second input being coupled to a sensed capacitor;
    a feedback resistor, coupled between the second input of the operational amplifier and the output of the operational amplifier;
    a feedback capacitor, coupled between the second input of the operational amplifier and the output of the operational amplifier; and
    a shunt circuit, having a first end coupled between the second input of the operational amplifier and the sensed capacitor and having a second end coupled to the reference level, the shunt circuit being configured for lowering a voltage amplitude of a signal at the second input of the operational amplifier; the shunt circuit is not placed on a feedback circuit path associated with the output of the operational amplifier.

10. A programmable band-pass filter circuit included by an analog front-end circuit and used for capacitance detection, comprises:

an operational amplifier, having a first input, a second input, and an output, the first input being coupled to a reference level, the second input being coupled to a sensed capacitor;
a feedback resistor, coupled between the second input of the operational amplifier and the output of the operational amplifier;
a feedback capacitor, coupled between the second input of the operational amplifier and the output of the operational amplifier;
a voltage buffer circuit, coupled to the reference level, configured for buffering and outputting the reference level; and
a shunt resistor, having a first end coupled between the second input of the operational amplifier and the sensed capacitor and having a second end coupled to an output of the voltage buffer circuit to couple to the buffered reference level;
wherein the voltage buffer circuit and the shunt resistor are not placed on a feedback circuit path associated with the output of the operational amplifier.

11. The programmable band-pass filter circuit of claim 10, wherein the voltage buffer circuit is an amplifier circuit.

12. The programmable band-pass filter circuit of claim 2, wherein the sensed capacitor includes a self-capacitance and/or a mutual-capacitance.

13. The programmable band-pass filter circuit of claim 2, wherein the feedback resistor includes a programmable resistance.

14. The programmable band-pass filter circuit of claim 2, wherein the feedback capacitor includes a programmable capacitance.

15. The programmable band-pass filter circuit of claim 10, wherein the sensed capacitor includes a self-capacitance and/or a mutual-capacitance.

16. The programmable band-pass filter circuit of claim 10, wherein the feedback resistor includes a programmable resistance.

17. The programmable band-pass filter circuit of claim 10, wherein the feedback capacitor includes a programmable capacitance.

* * * * *